United States Patent [19]
Gabriel et al.

[11] Patent Number: 5,702,978
[45] Date of Patent: Dec. 30, 1997

[54] SLOPED SILICON NITRIDE ETCH FOR SMOOTHER FIELD OXIDE EDGE

[75] Inventors: Calvin T. Gabriel, Cupertino; Olivier F. Laparra, San Jose, both of Calif.

[73] Assignee: VLSI Technology, Inc., San Jose, Calif.

[21] Appl. No.: 640,092

[22] Filed: Apr. 30, 1996

[51] Int. Cl.$^6$ .................................................. H01L 21/76
[52] U.S. Cl. ............................ 437/65; 437/70; 437/947; 437/981; 437/228 M
[58] Field of Search ........................ 437/69, 70, 72, 437/73, 61, 981, 947, 228 M

[56] References Cited

U.S. PATENT DOCUMENTS

| | | | |
|---|---|---|---|
| 4,561,172 | 12/1985 | Slawinski | 437/69 |
| 4,812,418 | 3/1989 | Pfiester et al. | 437/69 |
| 4,980,317 | 12/1990 | Koblinger | 148/DIG. 51 |
| 5,432,117 | 7/1995 | Yamamoto | 437/69 |

FOREIGN PATENT DOCUMENTS

| | | | |
|---|---|---|---|
| 0091447 | 7/1981 | Japan . | |
| 0283147 | 12/1986 | Japan | 437/69 |
| 0242335 | 10/1987 | Japan . | |
| 0136349 | 5/1989 | Japan | 437/69 |

OTHER PUBLICATIONS

*Silicon Processing For The VLSI ERA*, vol. 2: *Process Integration*; Stanley Wolf, Ph.D., Lattice Press, pp. 16–27.

*Proceedings of the Tenth Symposium On Plasma Processing*, Edited By G.S. Mathad and D.W. Hess, The Electrochemical Society, Proceedings vol. 94-20, pp. 280–291.

*Primary Examiner*—Trung Dang
*Attorney, Agent, or Firm*—Flehr Hohbach Test Albritton & Herbert LLP

[57] ABSTRACT

A method of fabricating an integrated circuit on a silicon substrate in such a manner as to avoid the requirement of over-etching the polysilicon usually necessary to prevent shorting of adjacent devices by poly filaments caused by deep polysilicon pockets in notch areas created in the field oxide during its growth. The notches are prevented by forming the nitride mask with sloped rather than perpendicular side walls. The sloped side walls present less resistance to the growing oxide than does the usual perpendicular wall and thus does not dig into the growing oxide to form the notches. The edge of the resultant field oxide is therefore smoother, permitting easier and more complete removal of the polysilicon without the need for over-etching.

8 Claims, 2 Drawing Sheets

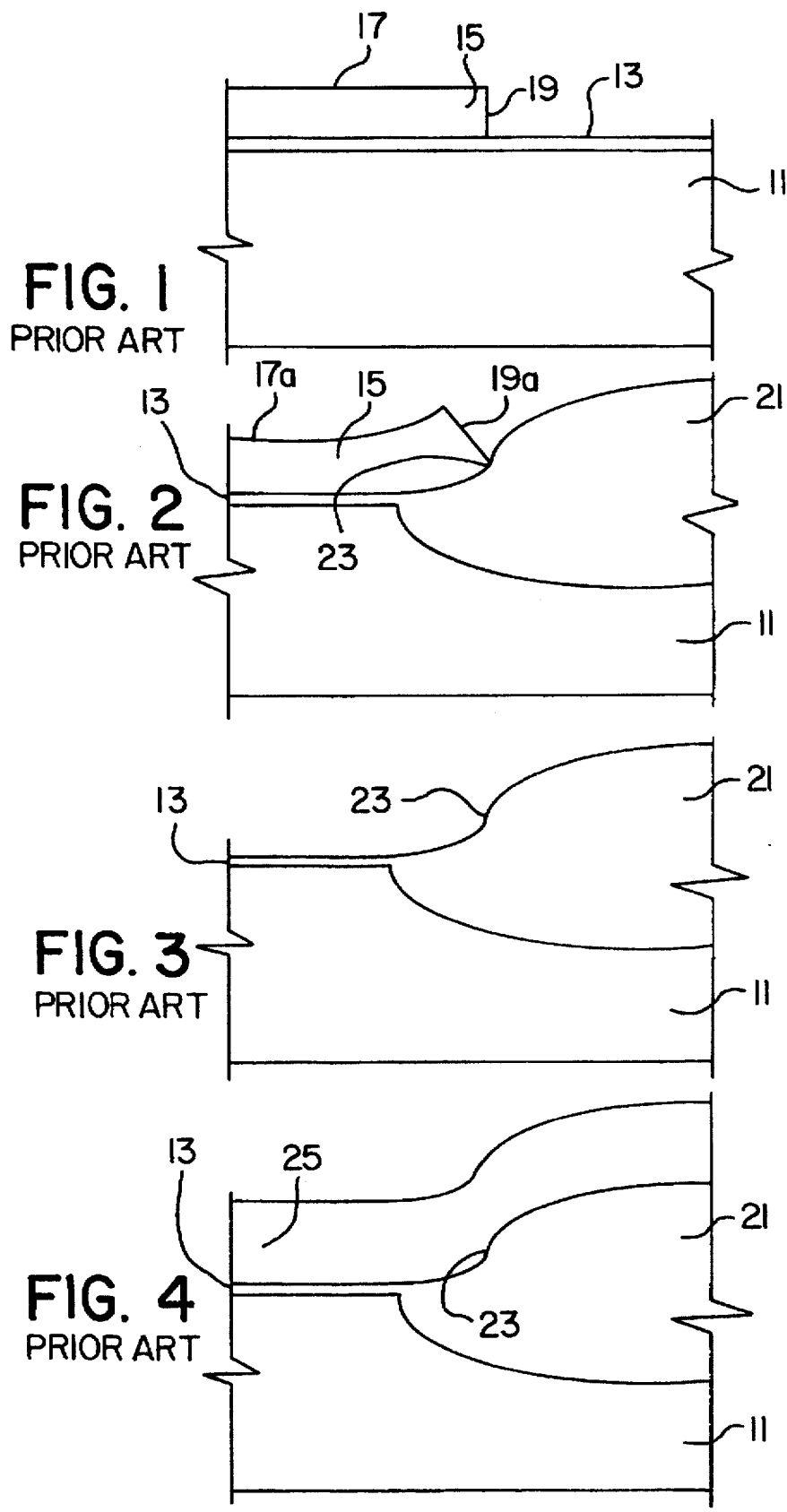

SLOPED SILICON NITRIDE ETCH FOR SMOOTHER FIELD OXIDE EDGE

The present invention relates generally to the method of fabricating integrated circuits, particularly MOS devices on a silicon wafer. More specifically, the invention relates to a manner of avoiding the need for extensive over etching to eliminate polysilicon filaments in a notch area where the field oxide meets and upsets the silicon nitride film during the oxidation step.

BACKGROUND OF THE INVENTION

The fabrication of MOS circuits necessarily requires a number of intricate steps. Typically, as relevant to this invention, these steps may include:

1. Cleaning and polishing a silicon wafer and then growing a pad oxide layer on its surface either thermally or by chemical vapor deposition (CVD).
2. Depositing a layer of silicon nitride over the pad oxide.
3. Applying and patterning a photoresist over the areas where active devices are to be formed.
4. Etching the nitride away in those areas not protected by the resist. Channel stop doping may also be added at this time.
5. Removing the resist.
6. Growing a field oxide to form isolation regions.
7. Removing the nitride mask.
8. Growing gate oxides.
9. Applying polysilicon over the entire surface using low pressure chemical vapor deposition (LPCVD).
10. Applying and patterning a photoresist over the polysilicon in those areas where contacts are to be located, such as at gates.
11. Etching the polysilicon away in those areas not covered by the resist.

There are, of course, many other steps before there is a finished product and, depending on the particular structure to be fabricated, different and still other intermediate steps may be required. During the step of growing the field oxide, a problem can develop because the oxide growth is not only vertical, but also somewhat lateral. It grows under the nitride thereby forcing the nitride upwardly in such a way that the growing field oxide is deformed at the edge of the nitride. As the field oxide grows adjacent to the nitride, stress forces the nitride layer upwardly away from the silicon wafer creating the well known bird's beak. However, the beak is particularly distorted at the lower edge of the nitride in that the impression of the nitride into the field oxide causes a notch which, in cross section, appears as a step in the field oxide. The side wall of the field oxide becomes almost vertical immediately adjacent the nitride edge. When the nitride is later removed, the notch and the vertical edge of the field oxide remain. Consequently, the transition of silicon oxide thickness from the edge of the pad oxide over the active area to its full thickness as a field oxide has typically not been smooth.

This lack of smoothness creates a problem when polysilicon is later applied over the entire surface so as to provide the gate electrode. The polysilicon, of course, is deposited in the notch area as well as the remainder of the surface. However, the vertical thickness of the polysilicon layer is noticeably greater in the notch area than it is over the remainder of the surface. If the polysilicon in the notch is not totally removed, poly filaments will result and adjacent devices on the wafer will be shorted together. In order to eliminate polysilicon in the small narrow notch area, the prior art has relied upon additional etching, called "over-etching". However, over-etching creates a number of other problems including: loss of gate oxide, gate oxide damage, loss of control of gate line width and thinning of the field oxide.

BRIEF SUMMARY OF THE INVENTION

In order to overcome the problems created by the collection of polysilicon in the notch area, the process of the invention reduces the notch itself rather than treat the effects of the notch. This may be accomplished by altering the manner in which the nitride is originally etched away in those areas not protected by photoresist (step 4 above). During this etch prior to field oxidation, the edge of the nitride is formed with a significant slope. As so formed, the edge of the nitride adjacent to the field oxidation is considerably thinner than the bulk of the nitride and, therefore, the stress available at that edge is much less than in the usual case. It has been found that with a sloped nitride, the field oxide transitions smoothly from the active area to its full thickness with substantially no notch at all. Without the notch there is no need for long over-etching of the polysilicon and consequently no resulting excessive loss of gate oxide, gate oxide damage, loss of control of gate line width nor even thinning of the field oxide, thereby providing improved overall device performance.

BRIEF DESCRIPTION OF THE DRAWINGS

FIG. 1 is a schematic cross-sectional view of a silicon wafer in process with nitride overlying a pad of silicon dioxide, the nitride having been etched in accordance with the prior art;

FIG. 2 is a view similar to FIG. 1 but showing the wafer after the field oxide has been grown with the resultant notch as formed with the prior art process;

FIG. 3 is a view similar to FIG. 2 but showing the wafer after the removal of the nitride, again showing the notch;

FIG. 4 is a view similar to the preceding views but showing a later stage of the process with a layer of polysilicon over the entire surface;

DESCRIPTION OF THE PREFERRED EMBODIMENTS

The Prior Art—FIGS. 1 Through 5

Figure 5:
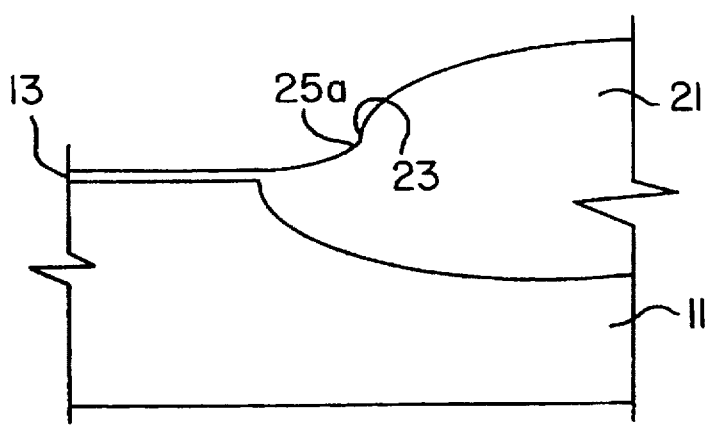
FIG. 5 is a view similar to the preceding views but showing a still later stage of the process wherein the layer of polysilicon is etched away except in the notch formed by the prior art process.

Referring to FIG. 1, there is schematically shown in cross-section, a silicon wafer 11 in process of fabrication into an integrated circuit or the like. The silicon wafer is coated with a pad or buffer oxide 13 and a layer of silicon nitride 15 which is intended to function as an oxidation mask in later steps. It should be noted that the silicon nitride layer includes, in the manner of the prior art, a top surface 17 and an edge surface 19 substantially perpendicular to the pad oxide 13 and to the silicon wafer 11 itself.

The size, shape and position of the silicon nitride is usually determined by an earlier photolithographic step including the selective application of a mask of resist panels to protect those areas where the active devices will be formed. The unmasked nitride is then later etched away leaving substantially perpendicular walls such as the wall 19.

Following the selective nitride etching, a field oxide 21 is grown. The results of this step are shown in FIG. 2. During the growth of the field oxide 21, the oxide progresses not only vertically into the silicon substrate itself, but also laterally along the line of the pad oxide 13. This lateral movement urges the nitride 15 upward creating a somewhat curved upper surface 17a and a side or edge surface 19a which is somewhat tilted. The nitride 15 resists this upward movement and thus causes a notch 23 to form in the gate oxide 21 at the corner of the silicon nitride. Later, as the process continues the silicon nitride 19 is removed leaving the device as shown in FIG. 3 with the notch 23 still formed in the field oxide 21.

As shown in FIG. 4, in a later step, a film of polysilicon 25 is formed over the entire wafer, including the pad oxide 13 as well as the field oxide 21. The polysilicon is provided to form contact points for transistor gates in the finished product. The polysilicon 25 covers the entire surface of the wafer, including the notch 23. Because the notch 23 comprises a narrow opening in the oxide, the deposited polysilicon in that area is somewhat thicker than it is on the smoother portions of the device. After the polysilicon is deposited, another photoresist and lithography step is employed covering those areas (not shown) where the contacts are to be positioned. A polysilicon etch is then applied with the intent of removing all the polysilicon except that below the resist (not shown) with as little damage as possible to the oxide lying below. When the wafer is subjected to the minimum etch for removal of the polysilicon along the major smooth surface of the oxide, there still remains a small area of polysilicon 25a in the notch area 23. In the prior art, significant over-etching is required to remove this small final portion. The over-etch, of course, creates additional problems including causing a loss of exposed gate oxide, gate oxide damage, loss of control of gate line width and thinning of the field oxide as well as the potential to cause charging and lateral etching of polysilicon lines underneath the photoresist mask. On the other hand, if the small portion of the polysilicon 25a is left in the final circuit, poly filaments result and adjacent devices will be shorted together.

Figure 6:
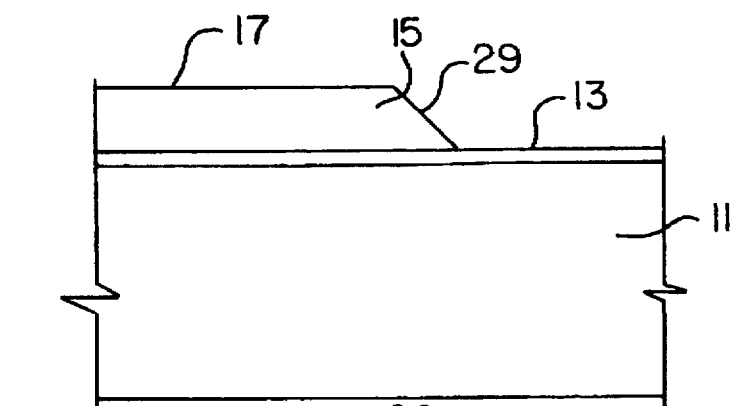
FIG. 6 is a view similar to FIG. 1 but showing the nitride having a sloped side edge in accordance with the invention.
Figure 7:
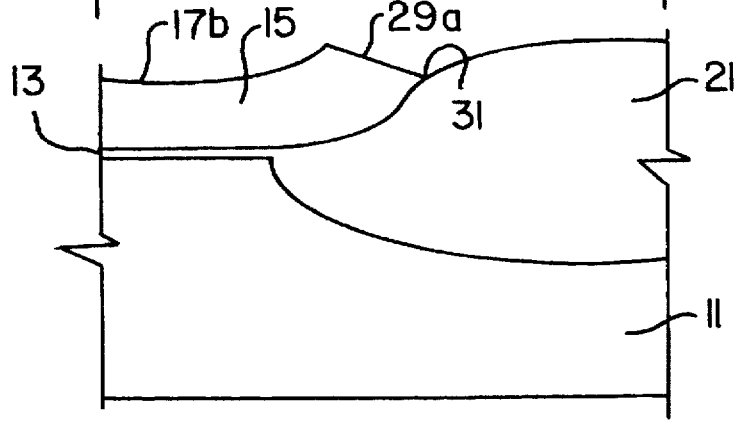
FIG. 7 is a view similar to FIG. 2 but showing the resultant growth of the field oxide without a notch by reason of the sloped nitride.
Figure 8:
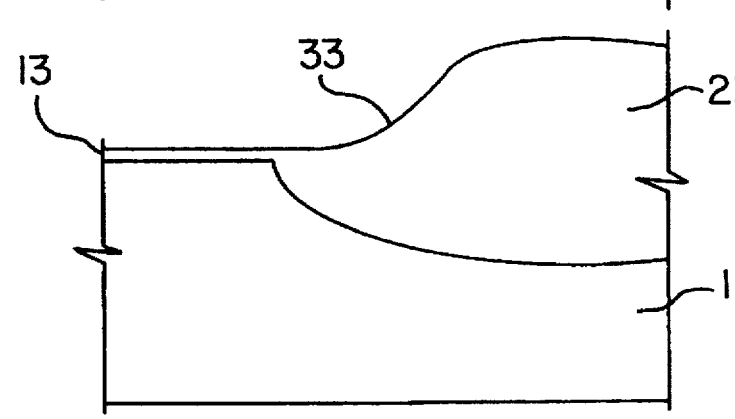
FIG. 8 is a view similar to FIG. 3 but showing the field oxide after the removal of the nitride again showing a smooth transition from the area of the pad oxide to the full height of the field oxide again illustrating that there is no notch.

The Invention—FIGS. 6 Through 8

In accordance with the invention, the steps of fabricating an active area on the silicon wafer include etching the silicon nitride layer in a manner, as shown in FIG. 6, to provide a layer of nitride 15 having the usual upper surface 17 but with an edge surface 29 not perpendicular to the underlying wafer but at a substantial angle of between 30° and 80°. With the sloped nitride, a relatively narrow edge contacts the pad oxide 13 overlying the silicon wafer.

It is generally known that a sloped edge can be formed during a nitride etch. The slope is determined principally by the choice of etch gas or gases and their flow rate. If multiple gases are employed, the ratio of their respective flow rates is also determinative. While other parameters, such as power and pressure, will have some effect, the selection of gases is most important. Common etch gases include $CF_4$, $C_2F_6$ and $CHF_3$. For slopes of from 30° to 80° any of these gases, either alone or in combination with each other in varying ratios, may be used to create the desired slope. With a ratio of $CF_4$:$CHF_3$=1:3, a slope of 45° may be obtained. For slopes less than about 45°, $CHF_3$ may be used without either $CF_4$ or $C_2F_6$. For slopes of about 80°, either $CF_4$ or $C_2F_6$ may be used.

Specifically, an acceptable sloped nitride edge of about 45° has been obtained by using a Lain 4520 Oxide Etcher (configured for 5" wafers) with settings as follows:

Pressure=200 mT
Power=550 W
Tap Setting=7
Gap=1.3 cm
Argon=200 sccm (standard cubic centimeters per minute)
$CF_4$=15 sccm
$CHF_3$=45 sccm
Nitride etch rate was 97.7 Å/sec.
Etch was to end point plus 80% over-etch.

With such settings, the plasma is ignited and the power is split between the top and bottom electrodes operating in reverse phase at 400 kHz while keeping reflected power below 25 watts.

Since the nitride edge is sloped, during the course of growing the field oxide 21 the oxide still travels laterally beneath the nitride and urges the nitride upwardly. However, since the nitride is rather thin at its edge point 31, it does not provide nearly as much resistance to the growth of the gate oxide as was the situation in the prior art as shown in FIG. 2. Consequently a notch is not formed, but rather, the transition from the pad oxide area 13 to the full height of the gate oxide is very smooth. When the nitride is subsequently removed by a minimal etching, such as shown in FIG. 8, there is no notch but only the smooth transition 33. Without the notch, the need for over-etching is substantially reduced thereby overcoming substantial problems with the prior art.

We claim:

1. A method for providing a smooth field oxide edge in the fabrication of an integrated circuit on a substrate comprising the steps of:

depositing a layer of nitride on the substrate;

etching the nitride away in those areas where active devices are not to be formed, said etching step comprising;

supplying $CF_4$ and $CHF_3$ gases into the etcher at a ratio of $CF_4$: $CHF_3$=1:3;

etching the nitride at least until the end point;

growing a field oxide on the substrate adjacent to said edge surface of the nitride;

removing the nitride;

applying gate material over the surface of the field oxide;

depositing a pattern of photoresist on the gate material in areas where gates are to be located; and etching the gate material away in those areas not covered by the resist.

2. A method for providing a smooth field oxide edge in the fabrication of an integrated circuit on a substrate comprising the steps of:

depositing a layer of nitride on the substrate;

etching the nitride away in those areas where active devices are not to be formed, said etching step comprising;

positioning said substrate in an oxide etcher having a top and a bottom electrode;

cooling the bottom electrode to −20° C. and clamping the substrate thereon with 10 torr helium pressure;

maintaining the pressure within the etcher at 200 mT;

maintaining the gap of the etcher at 1.3 cm;

supplying argon within the etcher at 200 sccm;

supplying $CF_4$ within the etcher at 15 sccm;

supplying $CHF_3$ within the etcher at 45 sccm;

igniting the plasma and maintaining the power of the etcher at about 550 W, split between the top and bottom electrodes operating in reverse phase at 400 kHz while keeping reflected power below 25 W;

etching the nitride until the end point and then overetching by 80%;

growing a field oxide on the substrate adjacent to said edge surface of the nitride;

removing the nitride;

applying polysilicon over the surface of the field oxide;

depositing a pattern of photoresist on the polysilicon in areas where gates are to be located; and etching the polysilicon away in those areas not covered by the resist.

3. A method for providing a smooth field oxide edge in the fabrication of an integrated circuit on a substrate comprising the steps of:

depositing a layer of nitride on the substrate; and etching said layer of nitride with gas selected from the group consisting of $CF_4$, $C_2F_6$ and $CHF_3$ so as to produce an edge surface at an angle of between 30° and 80° with the plane of the substrate.

4. The method as defined in claim 3, further including the steps of:

growing a field oxide on the substrate adjacent to said edge surface of the nitride;

removing the nitride;

applying polysilicon over the surface of the field oxide;

depositing a pattern of photoresist on the polysilicon in areas where gates are to be located; and etching the polysilicon away in those areas not covered by the resist.

5. The method as defined in claim 3 wherein the layer of nitride defines an edge surface disposed at an angle of approximately 45° with the plane of the substrate.

6. A method for providing a smooth field oxide edge in the fabrication of an integrated circuit on a substrate comprising the steps of:

depositing a layer of nitride on the substrate; and etching said layer of nitride with gas selected from the group consisting of a) $CHF_3+CF_4$ and b) $CHF_3+C_2F_6$ so as to produce an edge surface at an angle of between 30° and 80° with the plane of the substrate.

7. The method as defined in claim 6, further including the steps of:

growing a field oxide on the substrate adjacent to said edge surface of the nitride;

removing the nitride;

applying gate material over the surface of the field oxide;

depositing a pattern of photoresist on the gate material in areas where gates are to be located; and etching the gate material away in those areas not covered by the resist.

8. The method as defined in claim 6, the etching step further including the step of:

applying a selected gas ratio of $CHF_3$ and $CF_4$ or applying a selected gas ratio of $CHF_3$ and $C_2F_6$, wherein the angle of the edge surface produced by the etching step corresponds to the applied gas ratio.

\* \* \* \* \*